United States Patent
Yang et al.

(10) Patent No.: US 9,099,284 B2
(45) Date of Patent: Aug. 4, 2015

(54) METHOD AND SYSTEM FOR AUTOTUNING OF RF MATCH

(75) Inventors: James Yang, Union City, CA (US); Stanley Liu, Shanghai (CN); ZhaoHui Xi, Shanghai (CN)

(73) Assignee: ADVANCED MICRO-FABRICATION EQUIPMENT, INC. ASIA, Georgetown, Grand Cayman (KY)

( * ) Notice: Subject to any disclaimer, the term of this patent is extended or adjusted under 35 U.S.C. 154(b) by 382 days.

(21) Appl. No.: 13/337,246

(22) Filed: Dec. 26, 2011

(65) Prior Publication Data

US 2013/0119017 A1    May 16, 2013

(30) Foreign Application Priority Data

Nov. 16, 2011    (CN) .......................... 2011 1 0362541

(51) Int. Cl.
*G01R 31/00*    (2006.01)
*H01J 37/32*    (2006.01)
*H01L 21/311*    (2006.01)
*H03H 7/40*    (2006.01)

(52) U.S. Cl.
CPC ....... *H01J 37/32082* (2013.01); *H01J 37/3299* (2013.01); *H01J 37/32174* (2013.01); *H01J 37/32183* (2013.01); *H01J 37/32935* (2013.01); *H01L 21/31116* (2013.01); *H03H 7/40* (2013.01)

(58) Field of Classification Search
None
See application file for complete search history.

(56) References Cited

U.S. PATENT DOCUMENTS

| 6,077,357 | A | * | 6/2000 | Rossman et al. | ................ | 216/59 |
| 2006/0220574 | A1 | * | 10/2006 | Ogawa | ..................... | 315/111.21 |
| 2011/0162798 | A1 | * | 7/2011 | Zhang et al. | ............. | 156/345.28 |

* cited by examiner

*Primary Examiner* — Shamim Ahmed
*Assistant Examiner* — Bradford Gates
(74) *Attorney, Agent, or Firm* — Nixon Peabody LLP; Joseph Bach, Esq.

(57) ABSTRACT

A reactive correction to chamber impedance changes without the need to change the process recipe is disclosed. The reactive correction may be done automatically and repeatedly during processing. A control of RF power application to a plasma processing chamber is performed, so as to minimize reflected power and efficiently apply the RF power to the plasma. Autotuning of the RF power application is enabled without modifying a qualified process recipe. The autotuning can be applied using frequency matching and RF matching network tuning.

6 Claims, 2 Drawing Sheets

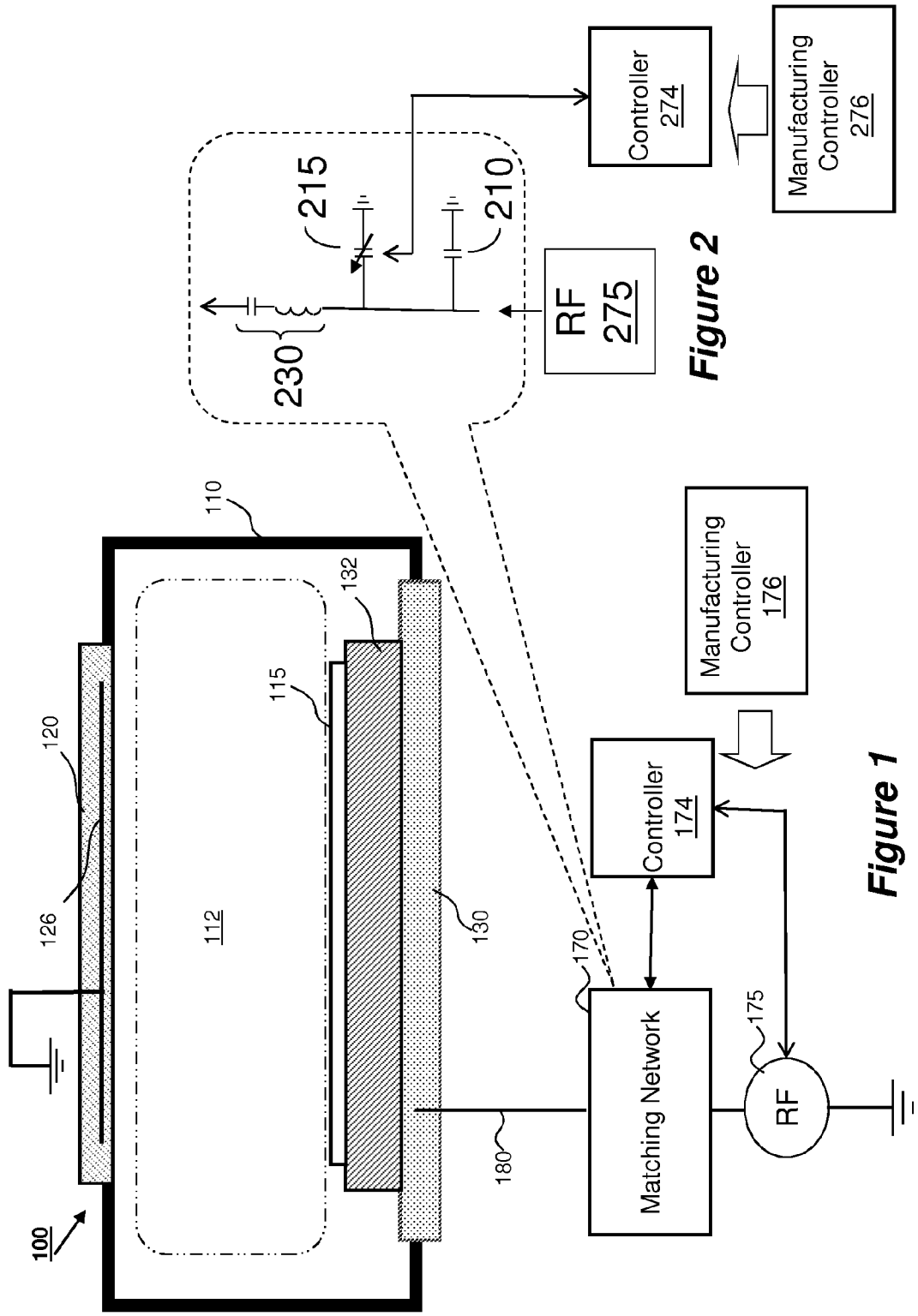

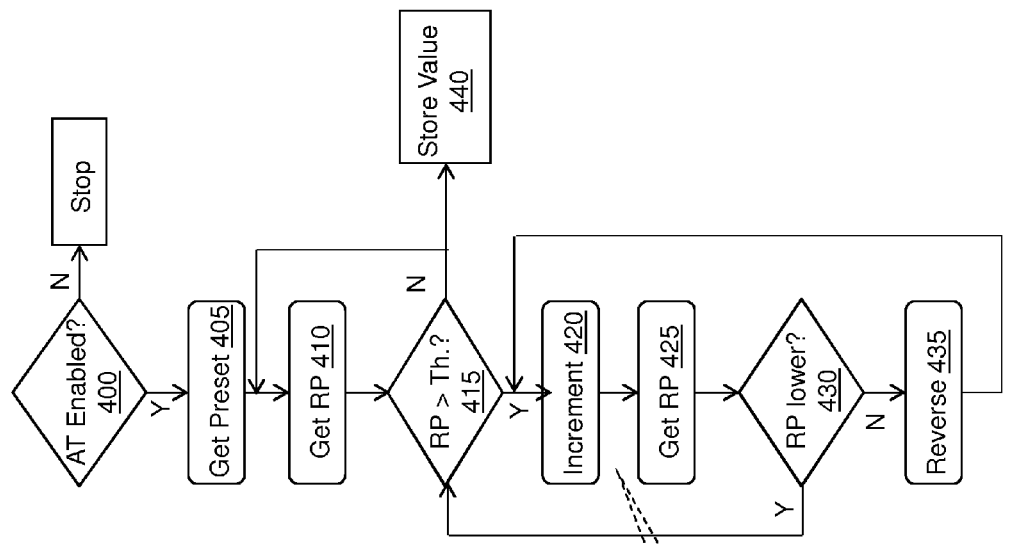
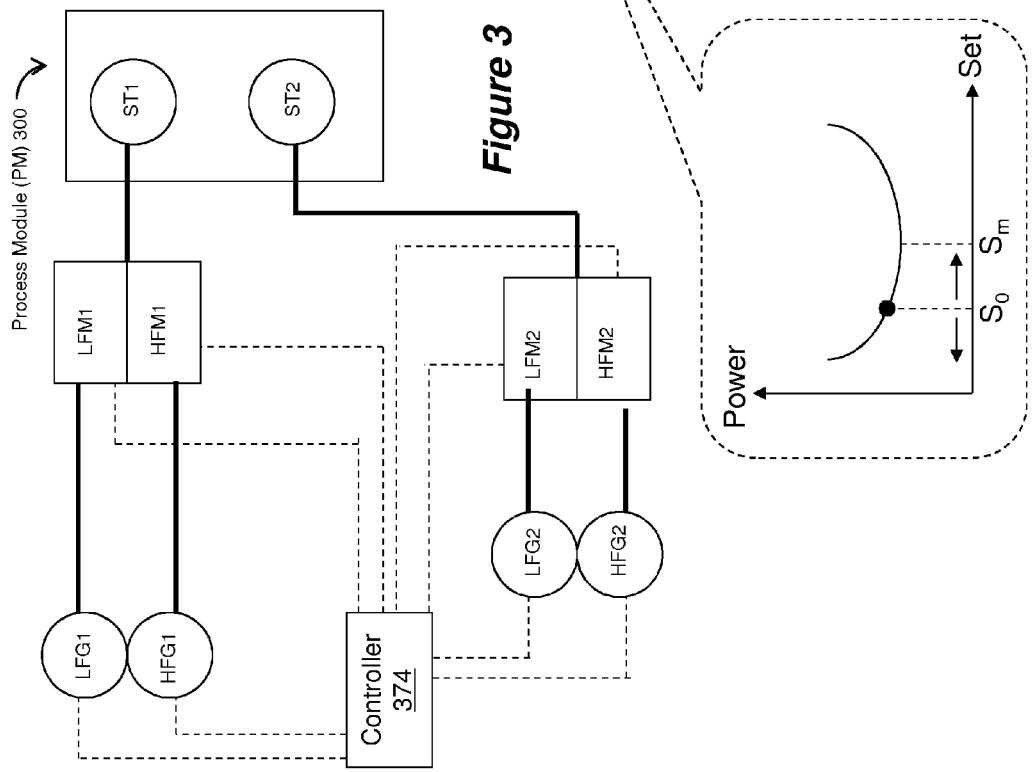
*Figure 4*
*Figure 3*

METHOD AND SYSTEM FOR AUTOTUNING OF RF MATCH

RELATED APPLICATION

This application claims priority from Chinese Patent Application Serial No. 201110362541.5, which was filed on Nov. 16, 2011, the entire disclosure of which is incorporated herein by reference.

BACKGROUND

1. Field of the Application

This application is in the field of application of RF power onto processing chambers so as to maintain plasma therein and, more specifically, for controlling the tuning of an RF matching circuit to minimize reflecting power.

2. Related Art

Various processing chambers are known in the art which utilize plasma for fabrication of semiconductor devices, flat panels, solar cells, etc. An example of such chambers include etch, chemical vapor deposition (CVD), plasma enhanced chemical vapor deposition (PECVD), metal organic chemical vapor deposition (MOCVD), vapor phase epitaxy (VPE), etc. In such chambers, an RF power source provides RF power at a prescribed frequency and power. The RF power is applied to an electrode or an antenna via an RF matching network. The RF matching network is designed to tune the transmission line to match the chamber's impedance so as to efficiently deliver the RF power to the chamber.

One problem of the prior art is that the chamber's impedance drifts or changes. For example, component aging and chamber condition, such as cleanliness, may lead to impedance drifting. Also, following preventive maintenance the chamber's impedance may change. Additionally, different substrates may lead to change in chamber's impedance. Accordingly, there is a need to monitor the chamber's impedance and tune the RF matching network to minimize reflective power and ensure efficient delivery of the RF power.

On the other hand, the various chambers and systems in the fabrication facility (fab) are generally controlled by a central host running production management software. In such an environment, once a recipe is qualified for a given system, it is stored on the central host. The host then operates the system according to the stored recipe. This recipe is not allowed to be changed without re-qualification. That is, if the recipe needs to be changed, due to, e.g., changes in the condition of the chamber, the changed recipe must be re-qualified before it is allowed to replace the old recipe. This is time and resource consuming activity, which fab managers would prefer to avoid.

However, when the chamber impedance changes or drifts, the recipe may need to be changed to correct for the impedance change. Accordingly, what is needed is a method and system enabling executing reactive measures to impedance drift or change without changing the stored recipe.

SUMMARY

The following summary is included in order to provide a basic understanding of some aspects and features of the disclosure. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the invention enable reactive correction to chamber impedance changes without the need to change the process recipe. The reactive correction may be done automatically and repeatedly during processing.

Embodiments of the invention provide a control of RF power application to a plasma processing chamber to minimize reflected power and efficiently apply the RF power to the plasma. Various embodiments enable autotuning of the RF power application without modifying a qualified process recipe. The autotuning can be applied using frequency matching and RF matching network tuning.

According to disclosed aspects, a method for operating a processing system including a plasma chamber, a local controller, and a remote manufacturing controller, is provided, comprising: storing a process recipe, including RF match network setting for the plasma chamber, in the manufacturing controller; energizing the plasma chamber using values of the process recipe; monitoring reflective power from the plasma chamber; varying setting of RF match network of the plasma chamber to achieve minimum reflected power and, when minimum reflected power is achieved, storing new RF match network setting in the local controller; and, subsequently operation the plasma chamber according to the process recipe, but using the new RF match network setting that is stored in the local controller. Varying setting of RF match network may comprise: comparing current reflected power to a threshold and if the current reflected power is outside the threshold performing: incrementing the setting of the RF match network in a first direction and determining whether reflected power increased or decreased; if increased, incrementing the setting of the RF match network in a second direction, opposite the first direction; if decreased, again incrementing the setting of the RF match network in the first direction. Each increment may be of a preset value.

According to further disclosed aspects, the method may further comprise continuing to increment the setting in the direction where reflected power is decreasing, until an increment indicates that reflected power is increasing; and, at that point, storing a replacement RF match network setting in the local controller. The RF match network setting may comprise setting of a variable element in the RF match network, such as a variable capacitor, a variable inductor, a variable resistor, or a combination thereof.

According to yet other aspects, a plasma processing system is provided, comprising: a plurality of plasma stations, each plasma station having a respective RF power applicator; a plurality of RF match networks, each coupled to a respective RF power applicator and each having a controllably variable element; a plurality of RF generators, each coupled to a respective RF match network; a local controller coupled to a manufacturing controller, the local controller operating the plurality of plasma stations according to recipe stored in the manufacturing controller and further selectively adjusting the controllably variable element of each RF match network according to either parameters received in said recipe or parameters stored locally in said local controller. The controller may continuously monitor reflected power from each plasma station and adjust the respective controllably variable element of each RF match network so as to minimize reflective power. When the controller adjusts the controllably variable element so as to minimize reflective power, it stores the adjusted setting locally and does not change the recipe stored in the manufacturing controller. The controllably variable element may comprise one of a variable capacitor, variable inductor and variable resistor, or a combination thereof.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify various embodiments and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements and are, therefore, not drawn to scale.

FIG. 1 is a schematic of a processing chamber having a controller according to an embodiment of the invention.

FIG. 2 illustrates an example of a matching network that can be implemented to perform the autotuning according to an embodiment of the invention.

FIG. 3 illustrates another example wherein the processing module has two processing stations.

FIG. 4 illustrates a flow chart of a process that can be executed by the controller to perform the autotuning according to an embodiment of the invention.

DETAILED DESCRIPTION

Embodiments of the invention provide control of RF power application to a plasma processing chamber to minimize reflected power and efficiently apply the RF power to the plasma. Various embodiments enable autotuning of the RF power application without modifying a qualified process recipe. The autotuning can be applied using frequency matching and RF matching network tuning.

FIG. 1 illustrates an example of a processing chamber 100 operating under the control of a remote manufacturing controller 176 and utilizing RF autotuning according to one example. The plasma chamber is generally defined by a chamber body 110, ceiling 120, and pedestal 130. In this particular example, the RF is coupled to the plasma capacitively, so the ceiling 120 functions as a showerhead to inject process gasses into the chamber, in a manner known in the art. The showerhead includes an electrode 126 that, in this example, is grounded. The pedestal supports a substrate chuck, e.g., an electrostatic chuck 132, upon which substrate 115 is placed. RF power is applied to pedestal 130 via conductive coupling 180 so as to ignite and maintain plasma 112. The RF power is generated by RF generator 175 and is transmitted to matching network 170. Controller 174 controls the operation of the RF power generator and the matching network and performs the autotuning to minimize reflective power and ensure efficient delivery of the RF power to the plasma, even under varying chamber impedance conditions.

FIG. 2 illustrates an example of a matching network that can be used with the inventive autotuning. As shown in the callout, the matching network may include an arrangement of capacitive and inductive elements 230. In order to vary the parameters of the matching network, a controllable variable tuning element, e.g. a variable capacitor, inductor, or resistor, or their combination, needs to be included. In this particular example, the matching network includes a fixed shunting capacitor 210 and a variable shunting capacitor 215, which functions as the variable tuning element. In this example, the tuning capacitor 215 may be, e.g., a motorized vacuum capacitor operated by controller 274, but other controllable variable elements may be used. Also, the controllable tuning element need not necessarily function as a shunting element.

In general, the tuning of the variable tuning element is done according to a recipe stored in the remote manufacturing controller 276. For example, when the system operates in its normal operating mode, the remote manufacturing controller 276 sends control signal to the local controller 274 to operate the chamber according to recipe stored in the remote controller 276. The remotely stored recipe includes the setting for the variable tuning element, and in general the local controller 274 uses the setting from the recipe to adjust the variable tuning element. However, once the setting is qualified, it is not allowed to be changed without lengthy re-qualification. Therefore, according to this embodiment, the controller includes local storage for a changed setting of the variable tuning element. If the local controller detects that the reflected power from the chamber is outside an allowable threshold, the local controller adjusts the setting of the variable tuning element and stores the new values locally. Then, on subsequent operations, the local controller 274 uses the locally stored values rather than the values received from the remote controller 276.

FIG. 3 illustrates another example wherein processing module 300 has two processing stations, ST1 and ST2. For example, two semiconductor wafers can be processed simultaneously, each in one of processing stations ST1 and ST2. In this example, each processing station is energized by two RF frequencies, low frequency, e.g., 2.2 MHz, 13.56 MHz, etc., and a high frequency, e.g., 24 MHz, 60 MHz, 100 MHz, etc. In this example, each processing station has its own RF channel comprising of a low frequency RF generator, LFG, low frequency matching network, LFM, high frequency RF generator HFG, and high frequency RF matching network, HFM. In one embodiment each system has three processing modules, having two processing stations each, thus requiring twelve RF channels. As shown in FIG. 3, all of the channels are controller by controller 374. In this embodiment, controller 374 is connected to each RF power generator and RF matching network via an RS232 cable.

When qualifying a recipe for the processing module, such as that shown in FIG. 3, the matching values are stored as part of the recipe. For example, if the matching network utilizes a variable capacitor, such as the one shown in FIG. 2, the value of the tuning capacitor is stored as part of the recipe. For example, for the processing module of FIG. 3 the following values may be stored as part of the recipe:

| Channel | Station 1 | Station 2 |
| --- | --- | --- |
| HF Capacitor | 60% | 70% |
| LF Capacitor | 30% | 40% |

These values are stored in the host manufacturing controller as part of the recipe to be run on the processing module.

According to one embodiment, during recipe qualification, the four values are tuned for minimum reflective power. These preset values are then stored with the recipe in the remote controller or host, and also stored in a separate file in the local controller of the processing modules, e.g., controller 374. Thereafter, whenever the host runs the recipe on the processing module, the autotuning controller, e.g., controller 374, monitors the reflective power. If the reflective power exceeds a preset threshold, the value of the respective RF matching network is adjusted until an acceptable reflective power is achieved. The new values, corresponding to the newly found minimum reflective power are then stored in the local controller, without changing the recipe values stored in the remote host. Consequently, while the host continues execution of the stored recipe, the actual tuning of the match network is varied independently of the recipe, thus enabling autotuning without requalification of the recipe.

FIG. 4 illustrates a flow chart of a process that can be executed by the controller to perform the autotuning according to an embodiment of the invention. In step 400 it is checked whether autotuning is enabled. That is, according to one embodiment, the operator has the option to disable the autotuning and force the system to use only the tuning values stored in the recipe. If autotuning is disabled, the process stops. If autotuning is enabled, in step 405 the controller fetches the preset values of the matching network. In step 410 the controller reads the reflective power value and in step 415 compares the read value to a set threshold. If the value is below a preset threshold, the controller reverts to reading the reflected power. For example, the controller can perform one reading every set period, e.g., 1-5 seconds.

If in step 415 the read reflected power value is larger than the preset threshold, in step 420 the controller increments the value of the matching network one step in one direction, e.g., increases the capacitance one step. In step 425 the controller again reads the reflected power value and in step 430 checks whether the new reading is lower than the previous reading. If so, it checks whether the new read value is below the set threshold. If the new read reflected power value is within the set threshold, the controller stores the new matching network setting locally, step 440, without changing the matching network value stored in the host with the recipe.

If at step 430 the controller determines that the new read value is larger than the previous reading, it means that the increment was in the wrong direction and the controller changes, i.e., reverses, the direction in step 435. For example, if in step 420 the capacitance was increased and in step 430 it is determined that the new value is larger than the previous value, then the controller reverse direction and the following increments are decreases in the capacitance value. That is, after step 435 the controller performs another increment but in the reverse direction. In this example, each increment is performed in steps of a given preset value, e.g., 1%. Once the proper setting is achieved, the new values are stored locally by the controller, step 440, without changing the values stored in the recipe. In this manner, reflected power can be minimized during processing without having to change the recipe and re-qualify the recipe.

As shown by the curve in the callout of FIG. 4, the reflected power (y-axis) varies with respect to the variable capacitor's setting (x-axis). The variability will have a minima that the controller seeks to find. In the callout it is shown that in setting $S_0$, the reflected power is higher than the possible minima at Sm. Thus, the controller moves the setting one step in one direction (in the direction of one of the arrows), and check to see whether this caused the reflected power to decrease or increase. If it increased, the controller changes direction and increments the setting in the other direction. This continues until the controller finds the setting Sm, which is for the minimum reflected power. Note that when the processor increments the setting in the direction of the arrow pointing to the right in the callout, the reflected power will decrease at each step, until the next increments overshoots the minima, Sm, at which point the reflected power starts to increase again. The processor then restores the setting and stores the last value just prior to the increment causing increase in reflected power.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The terms and expressions used in describing the embodiments were employed for the purpose of description and not limitation, such that their use is not intended as excluding any equivalents or alternatives.

The present invention has been described in relation to particular examples, which are intended in all respects to be illustrative rather than restrictive. Those skilled in the art will appreciate that other implementations of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method for operating a processing system including a plasma chamber, a local controller, and a remote manufacturing controller, comprising:
   storing a process recipe, including RF match network setting for the plasma chamber, in the remote manufacturing controller;
   providing local storage for storing local values of RF match network setting;
   energizing the plasma chamber using values of the process recipe and selecting initial RF match network setting according to: when local values of RF match network setting are stored in the local storage, selecting the local values, and when no local values of RF match network setting are stored in the local storage, selecting RF match network setting values included in the process recipe;
   monitoring reflective power from the plasma chamber;
   varying setting of RF match network of the plasma chamber to achieve minimum reflected power and, when minimum reflected power is achieved, storing new RF match network setting in the local storage; and,
   subsequently operating the plasma chamber according to the process recipe, but using the new RF match network setting that is stored in the local storage; and,
   wherein varying setting of RF match network comprises:
   comparing current reflected power to a threshold and if the current reflected power is outside the threshold performing:
   incrementing the setting of the RF match network in a first direction and performing a comparison operation comprising:
      determining whether reflected power increased or decreased;
      if increased, incrementing the setting of the RF match network in a second direction, opposite the first direction;
      if decreased, determining whether reflected power, measured after the step of incrementing the setting, is below the threshold and, if so, storing new RF matching network values in the local storage, and again incrementing the setting of the RF match network in the first direction and repeating the comparison operation until the comparison operation indicates reflected power increase, at which point the process of incrementing the setting of the RF is stopped.

2. The method of claim 1, wherein each increment is of a preset value.

3. The method of claim 2, further comprising continuing to increment the setting in the direction where reflected power is decreasing, until an increment indicates that reflected power is increasing; and, at that point, storing a replacement RF match network setting in the local controller.

4. The method of claim 1, wherein the RF match network setting comprises setting of a variable element in the RF match network.

5. The method of claim 4, wherein the variable element comprises a variable capacitor.

6. The method of claim 4, wherein the variable element comprises a variable inductor.

* * * * *